United States Patent
Allsup et al.

[11] Patent Number: 6,157,051
[45] Date of Patent: Dec. 5, 2000

[54] MULTIPLE FUNCTION ARRAY BASED APPLICATION SPECIFIC INTEGRATED CIRCUIT

[75] Inventors: Steven J. Allsup, Orange; Bjorn M. Dahlberg, Irvine, both of Calif.

[73] Assignee: Hilevel Technology, Inc., Tustin, Calif.

[21] Appl. No.: 09/172,902

[22] Filed: Oct. 15, 1998

Related U.S. Application Data

[60] Provisional application No. 60/092,348, Jul. 10, 1998.

[51] Int. Cl.$^7$ .................................................. H01L 27/10
[52] U.S. Cl. .......................................... 257/207; 257/202
[58] Field of Search ..................................... 257/202–211

[56] References Cited

U.S. PATENT DOCUMENTS

| | | | |
|---|---|---|---|
| 4,942,317 | 7/1990 | Tanaka et al. | 257/203 |
| 5,162,893 | 11/1992 | Okano | 257/203 |
| 5,285,069 | 2/1994 | Kaibara et al. | 257/392 |
| 5,365,091 | 11/1994 | Yamagishi | 257/203 |
| 5,387,809 | 2/1995 | Yamagishi et al. | 257/203 |
| 5,670,802 | 9/1997 | Koike | 257/207 |
| 5,828,108 | 10/1998 | Toyoda | 257/372 |
| 5,945,846 | 8/1999 | Iwao et al. | 257/207 |
| 5,969,544 | 10/1999 | Iwao et al. | 257/206 |
| 5,986,294 | 11/1999 | Miki et al. | 257/203 |

*Primary Examiner*—David Hardy
*Attorney, Agent, or Firm*—Knobbe, Martens, Olson & Bear, LLP

[57] ABSTRACT

An array based application specific integrated circuit includes four application specific integrated circuits on one die. Each of the four application specific integrated circuits functions in a certain mode. Only one of the four application specific integrated circuits is activated at any time. Activation of a mode is determined by the configuration of mode selection circuitry of the array based application specific integrated circuit. The four modes are not interrelated, and the four application specific integrated circuits do not share transistors in the array based application specific integrated circuit. The four application specific integrated circuits may share input/output pins of the array based application specific integrated circuit.

2 Claims, 11 Drawing Sheets

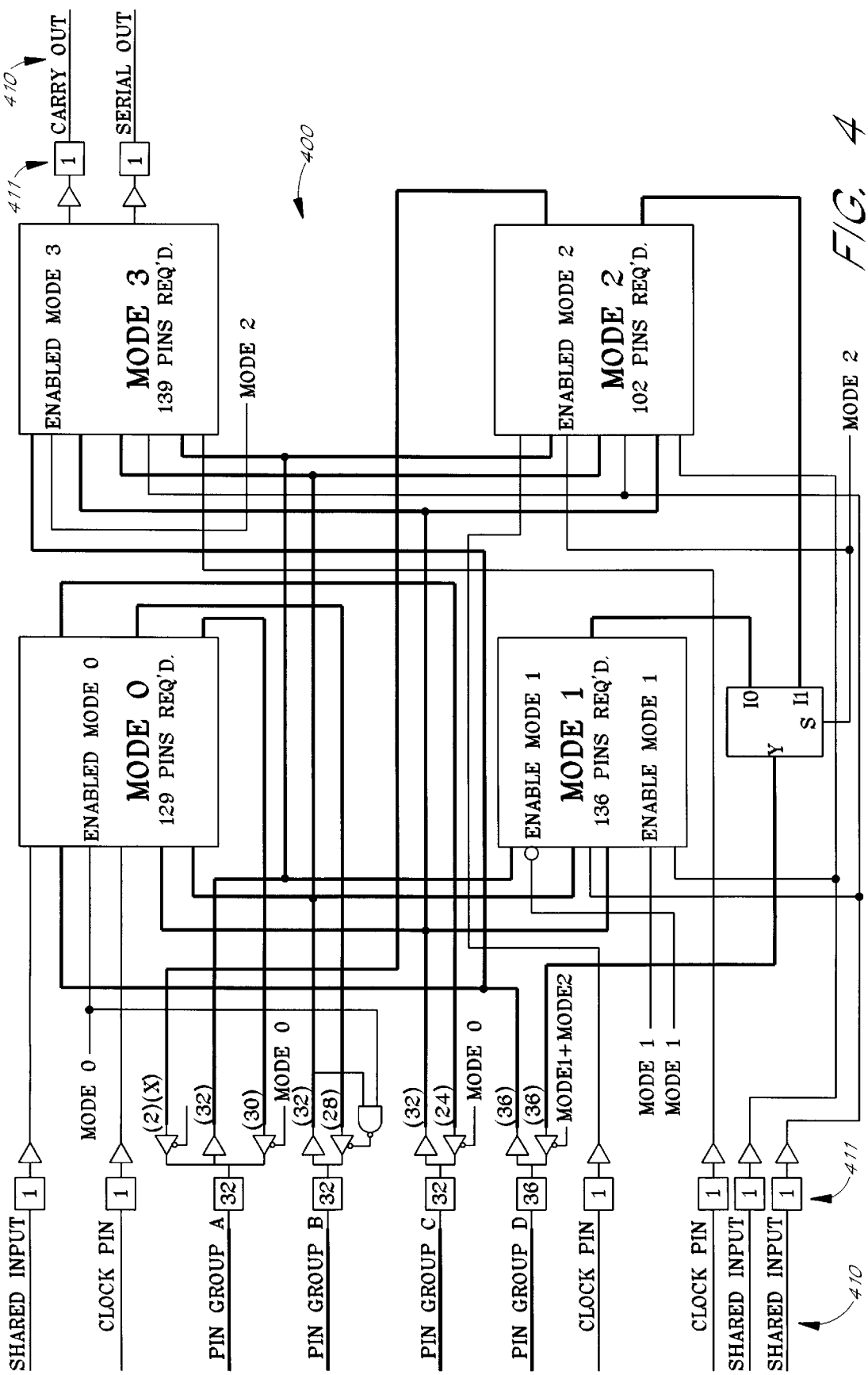

MULTIPLE FUNCTION ARRAY BASED APPLICATION SPECIFIC INTEGRATED CIRCUIT

RELATED APPLICATION

This application claims the benefit of priority under 35 U.S.C. § 119(e) of U.S. Provisional Patent Application Ser. No. 60/092,348, filed on Jul. 10, 1998.

BACKGROUND OF THE INVENTION

1. Field of the Invention

The invention relates to integrated electronic circuitry, specifically array based application specific integrated circuits (ASICs).

2. Description of the Related Art

An array based application specific integrated circuit (ASIC) as known in the electronics industry is a semiconductor device with tens of thousands to hundreds of thousands of transistors on a single chip that may be interconnected through several metallization layers according to customer specifications.

Array based ASICs offer high logic density and fast customized implementation of a customer's logic due to the few number of masks required. As such, array based ASICs have moderate costs and turnarounds, especially when design changes and enhancements are so predominant in the electronics industry.

However, array based ASICs have several drawbacks. Typically, although ASICs have hundreds of inputs and outputs and sometimes hundreds of thousands of transistors, a significant percentage of the transistors and many of the inputs and outputs are unused in the final design. This waste can be substantial in the face of large scale production.

Some array based ASICs are processed to achieve but one function. Besides the probable waste of transistors, inputs and outputs, such devices suffer from inventory risks. If the particular array based ASIC with a given function becomes obsolete, a manufacturer would be unable to utilize its large inventory. Furthermore, mistakes in processing reduce the yield of a single function array based ASIC forcing the manufacturer to scrap the die.

Other array based ASICs are processed to achieve several functions. Such ASICs suffer from high non-recurring engineering charges (NRE). This is because the design of masks to interrelate the functions and the transistors on the chip is a time intensive process. Such ASICs thus suffer from design risks. The higher the complexity of the interrelationships among the functions and transistors, the greater time and effort is required for modifications and enhancements. In addition, the yield suffers considerably more than for a single function ASIC. The waste is accentuated since a few nonworking transistors can disable all the functions of the array based ASIC since they are interrelated in function and the sharing of transistors.

SUMMARY OF THE INVENTION

The present invention includes a method for increasing the utilization of available gates in a single gate array die having a plurality of gates which are interconnectable as application specific integrated circuits. The method comprises interconnecting first and second pluralities of the gates in the die in accordance with first and second interconnect patterns for first and second application specific integrated circuits, respectively. The method selectively activates only one of the first and second application specific integrated circuits at any particular time. The method also selectively activates the first plurality of output connections only when the first application specific integrated circuit is activated and selectively activates the second plurality of output connections only when the second application specific integrated circuit is activated. The first and second application specific integrated circuits require first and second pluralities of input connections and first and second pluralities of output connections, respectively. The second plurality of gates does not include gates from the first plurality of gates. The second plurality of input connections includes at least one of the first plurality of output connections, and the second plurality of output connections includes at least one of the first plurality of input connections.

The present invention also includes a single gate array die having a plurality of gates. The die is optimized to utilize a high percentage of the gates on the die. The gates are interconnectable as application specific integrated circuits. The die comprises means for interconnecting a first plurality of the gates in the die in accordance with a first interconnect pattern for a first application specific integrated circuit. The die also comprises means for interconnecting a second plurality of the gates in the die in accordance with a second interconnect pattern for a second application specific integrated circuit. The second plurality of the gates includes no gates from the first plurality of gates. The die further comprises means for selectively activating only one of the first and second application specific integrated circuits at any particular time. The first application specific integrated circuit requires a first plurality of input connections and a first plurality of output connections. The second application specific integrated circuit requires a second plurality of input connections and a second plurality of output connections. The second plurality of input connections includes at least one of the first plurality of output connections, and the second plurality of output connections includes at least one of the first plurality of input connections. The die comprises means for selectively activating the first plurality of output connections only when the first application specific integrated circuit is activated and selectively activating the second plurality of output connections only when the second application specific integrated circuit is activated.

A semiconductor gate array die is optimized to utilize a high percentage of gates on the die. The die comprises a first application specific integrated circuit formed by interconnecting a first plurality of gates of the die. The die also comprises a second application specific integrated circuit formed by interconnecting a second plurality of gates of the die. The die also includes a plurality of input/output connections. The second plurality of gates comprises gates not included in the first plurality of gates. The input/output connections include a first plurality of connections which are input connections for the first application specific integrated circuit and which are output connections for the second application specific integrated circuit. A second plurality of connections are input connections for the second application specific integrated circuit and are output connections for the first application specific integrated circuit. A third plurality of connections are input connections for both the first application specific integrated circuit and the second application specific integrated circuit.

BRIEF DESCRIPTION OF THE DRAWINGS

The present invention is described in more detail below in connection with the attached drawing figures in which:

FIG. 4 illustrates a block diagram of an array based ASIC;

DETAILED DESCRIPTION OF THE PREFERRED EMBODIMENT

Figure 1:
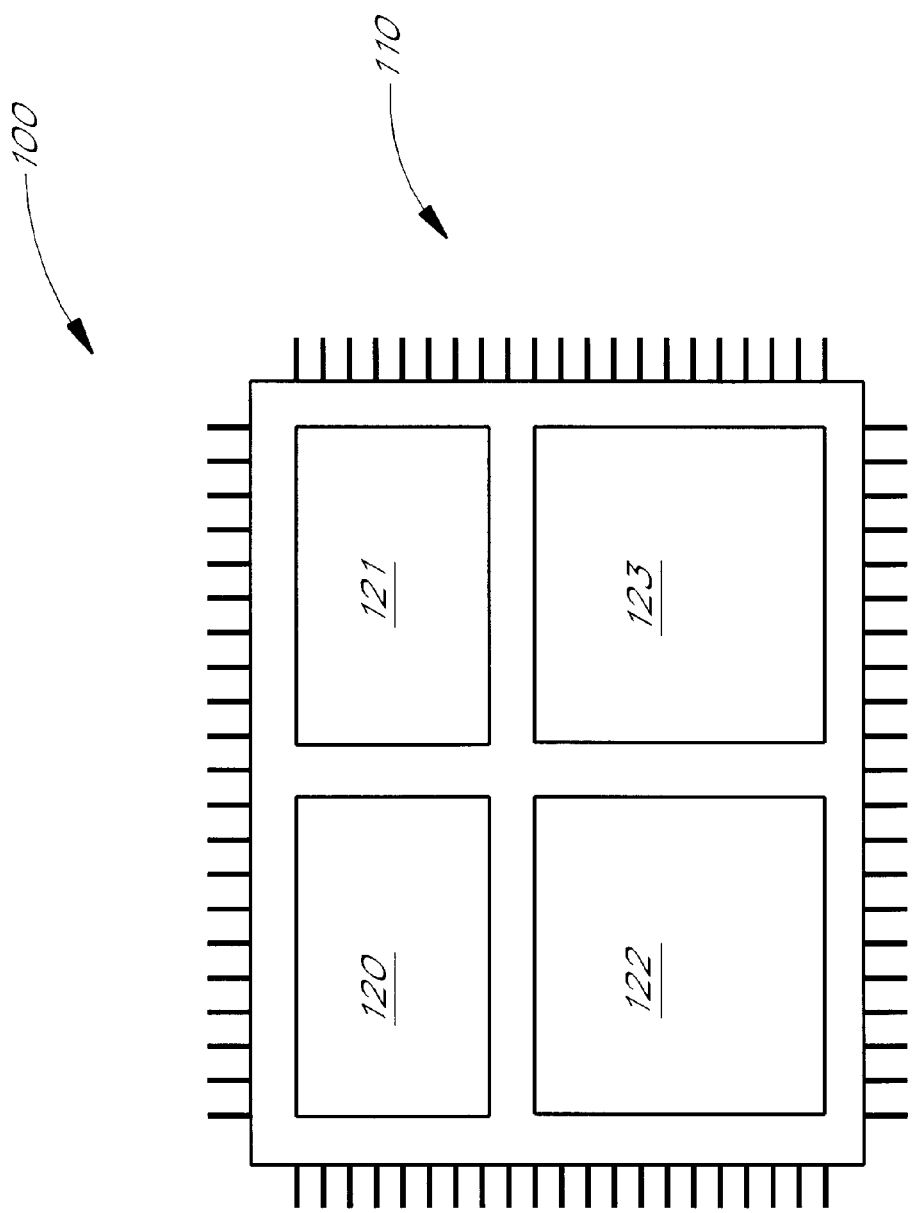
FIG. 1 pictorially illustrates an array based ASIC having four modes.

FIG. 1 pictorially illustrates an array based ASIC 100 in schematic view. The ASIC 100 has input/output pins 110 and has been processed to create four different zones 120–123 on a single die. Each of the four zones 120–123 has its own function or mode. The modes may function in similar or different ways. The modes are not interrelated, although, as discussed below, they share the limited pool of input/output pins 110 and may share common control circuitry (not shown). Although illustrated as four generally equal sized zones, fewer or more zones can be provided. Furthermore, the zones need not, and generally are not, the same size.

In the preferred embodiment, when one zone is being used, the other zones are inactive. Furthermore, as FIG. 1 indicates, the modes do not share transistors, or at most, share a very small percentage of all the transistors. The zones are preferably designed to disable any clocking in the unused zones. This has the advantage of reducing power requirements since the array based ASIC should ideally expend energy only in the zone whose mode is being asserted. Furthermore, activating only the zone whose mode is needed reduces overall noise throughout the die.

The preferred embodiment uses the die space efficiently. As FIG. 1 implies, multiple zones can be mapped out to use a high percentage of the available transistors on a single die. In fact, additional functions can be added where addition space is available. Running out of input/output pins 110 is not a significant concern here where only one mode is active and can access a large percentage of the input/output pins 110.

The preferred embodiment also has the advantage of low non-recurring engineering charges (NRE). Since the four modes are not related and share few, if any, transistors, they can be designed separately. Moreover, the lack of interrelationship between the modes and the transistors in the zones simplifies the complexity of mask designs, eliminating additional masking layers, thus lowering costs.

Accordingly, the useful die yield of these array based ASICs will be high. Because the modes and their accompanying zones of transistors are not related, the design is less complex and the masking steps are minimized resulting in fewer errors and higher yields. In addition, since the array based ASIC will only have one mode active, the other modes need not be functional. Thus, if a group of transistors fail and disable one of the modes on a given array based ASIC, the array based ASIC can still be sold, at perhaps a discounted price, to function as one of the three remaining modes.

Another advantage of the preferred embodiment is that design risks are low. Because each mode and its corresponding zone are not related or minimally related to the other zones, a given mode can be redesigned without redesigning the other modes. Design errors can be isolated. This advantage and others mentioned above lead to quick prototype turnaround time.

The preferred embodiment does not suffer from high inventory risks. One embodiment of the array based ASIC has four different modes. Such variety lowers inventory risk, since the ASIC can be bought to function in any one of the four modes. Furthermore, if one of the modes becomes obsolete, the ASIC can still run in any of the remaining modes.

Figure 2:
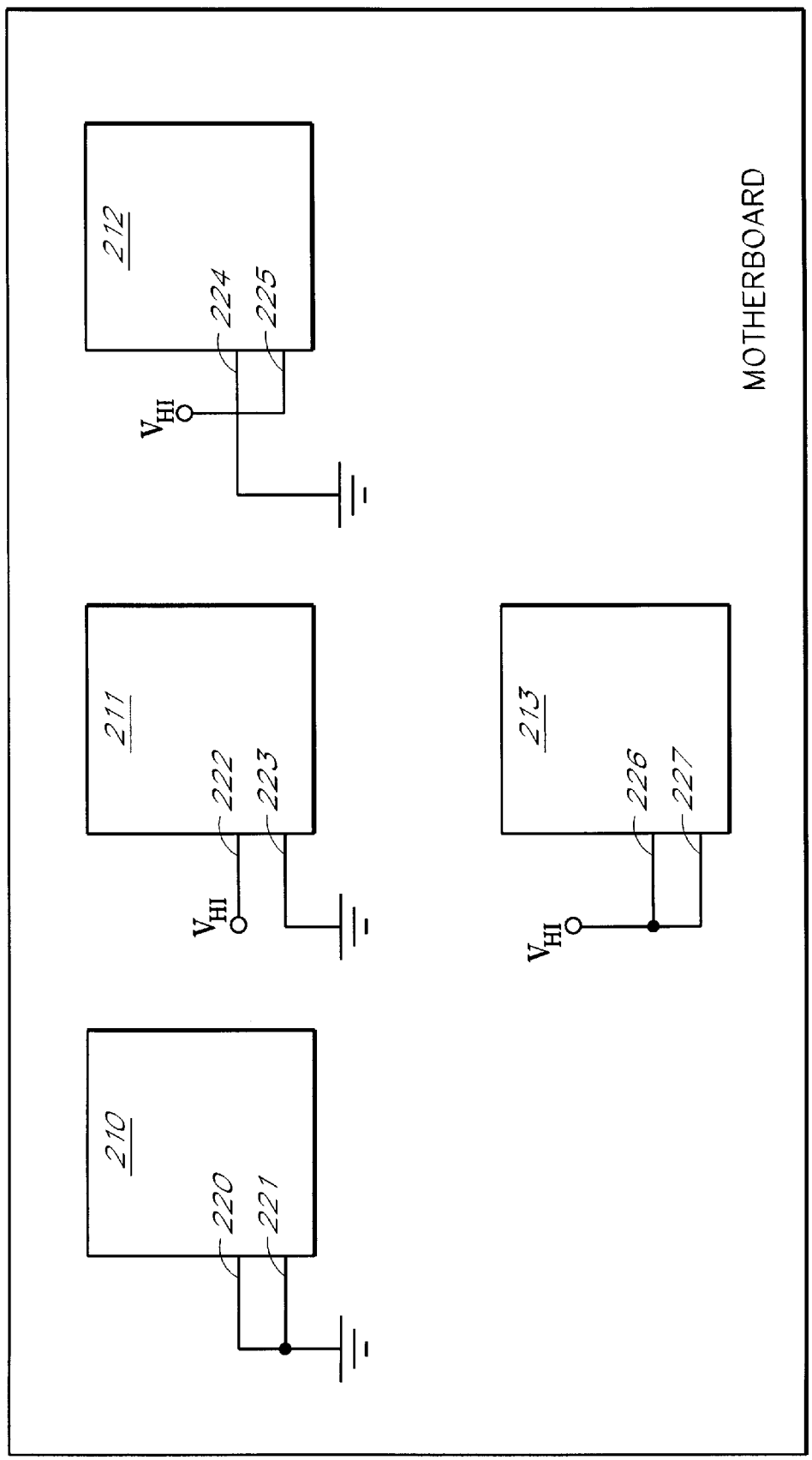
FIG. 2 pictorially illustrates a motherboard with four array based ASICs.

FIG. 2 pictorially illustrates a plurality of array based ASIC in accordance with the present invention utilized to provide four distinct functional elements on a motherboard 200. The motherboard 200 has circuitry and chips including four array based ASICs 210–213. The array based ASIC 210 has two selection pins 220, 221. The array based ASIC 211 has two selection pins 222, 223. The array based ASIC 212 has two selection pins 224, 225. The array based ASIC 213 has two selection pins 226,227. The respective pairs of selection pins are programmed to determine which mode is active. In this embodiment, each array based ASIC can function in one of four different modes. The first array based ASIC 210 is set by connecting its first and second selection pins 220–221 to electrical ground. This causes the first array based ASIC 210 to function in mode zero (i.e., the selection pins 220–221 are set to logical 00). The second array based ASIC 211 is set by connecting its first selection pin 222 to a pull-up voltage, $V_{HI}$, and its second selection pin 223 to electrical ground (i.e., the selection pins 222–223 are set to logical 01). This causes the second array based ASIC 211 to function only in mode one. The third array based ASIC 212 is set by connecting its first selection pin 224 to electric ground and its second selection pin 225 to a pull-up voltage (i.e., the selection pins 224–225 are set to logical 10). This causes the third array based ASIC 212 to function only in mode two. The fourth array based ASIC 213 is set by connecting its first and second selection pins 226–227 to a pull-up voltage (i.e., the selection pins 226–227 are set to logical 11). This causes the fourth array based ASIC 213 to function only in mode three. In the illustrated configurations, each array based ASIC 210–213 is operating in a different mode.

The advantages of such an implementation become apparent. A manufacturer or producer of motherboards can buy large volumes of these array based ASIC chips and, by configuring the selection pins, have a given array based ASIC chip function in a selected mode. Thus, if any one of the four array based ASICs displayed in FIG. 2 were to fail, it could be replaced by any other array based ASIC chip which will be automatically properly configured through the selection pins. Large volume purchases and production which are directly attributable to the interchangeability of the ASIC reduce unit cost and the overall inventory risk.

Figure 3B:
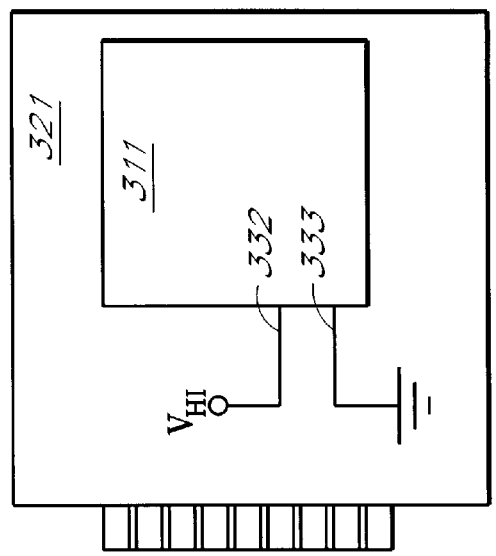
FIG. 3B pictorially illustrates a second type of interface card with an array based ASIC.
Figure 3A:
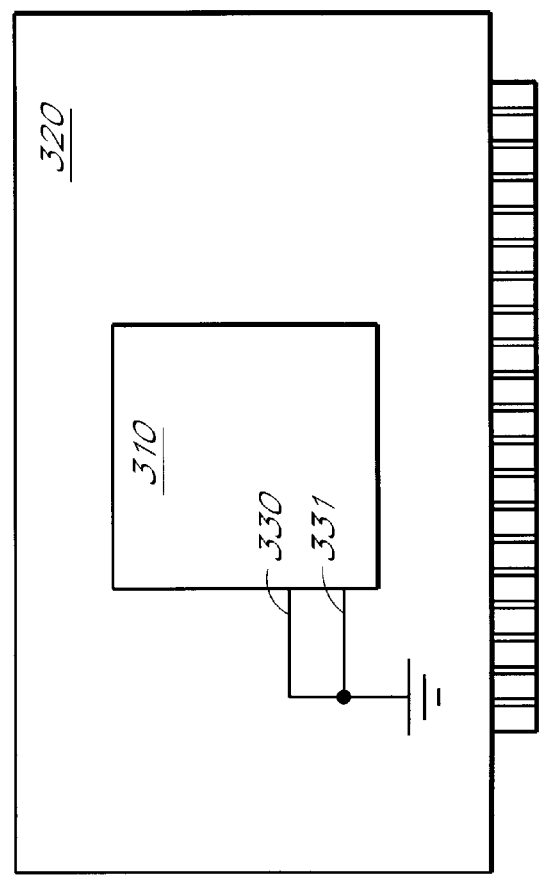
FIG. 3A pictorially illustrates a first type of interface card with an array based ASIC.
Figure 3D:
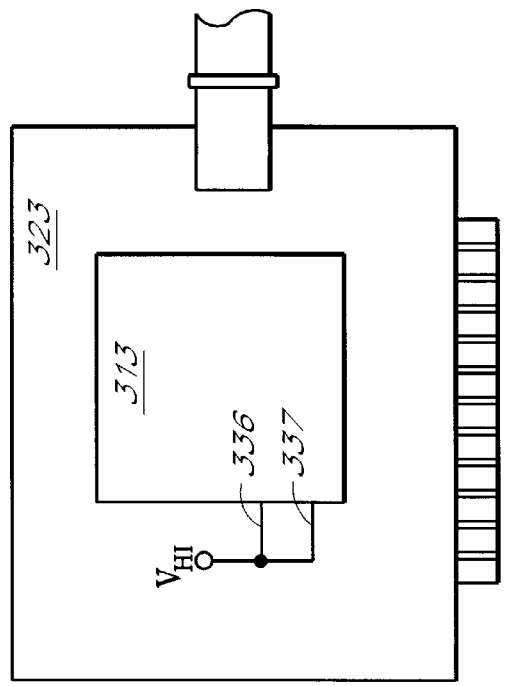
FIG. 3D pictorially illustrates a fourth type of interface card with an array based ASIC.
Figure 3C:
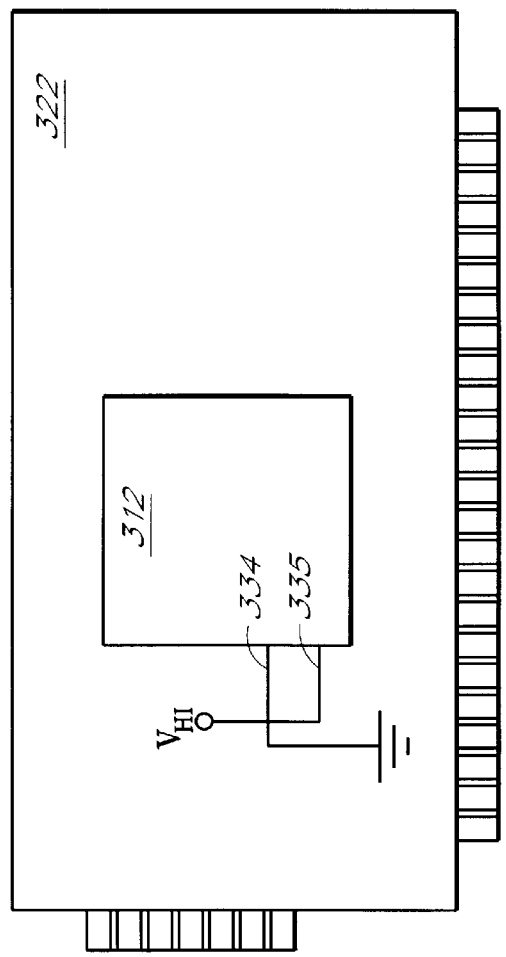
FIG. 3C pictorially illustrates a third type of interface card with an array based ASIC.

FIGS. 3A–D show array based ASICs 310–313 placed on four different types of interface cards 320–323. FIG. 3A shows a first kind of interface card 310 including an array based ASIC 340 whose first and second selection pins 330–331 are both connected to electrical ground (i.e., 00). Thus, in this embodiment, the array based ASIC 310 is functioning only in mode zero. FIG. 3B shows a second kind of interface card 321 including an array based ASIC 311 with the first selection pin 332 connected to a pull-up voltage and the second selection pin 333 connected to electrical ground (i.e., 01). Thus, this array based ASIC 311 is operating only in mode one. FIG. 3C shows a third kind of interface card including an array based ASIC 312 with the first selection pin 334 connected to electrical ground and the second selection pin 335 connected to a pull-up voltage (i.e., 10). Thus, this array based ASIC 312 is functioning only in mode two. FIG. 3D shows a fourth kind of interface card including an array based ASIC 313 with the first and second selection pins 336–337 connected to a pull-up voltage (i.e., 11). Thus, this array based ASIC 313 is functioning only in mode three. For each array based ASIC 310–313, ideally, only that zone on the die associated with the active mode is active. As will be discussed below, only a minimal amount of control logic and some common interface buffers are active in all four modes.

FIG. 4 shows a circuit schematic of an array based ASIC 400. The array based ASIC 400 shown in FIG. 4 has, for example, 144 input/output pins 410 and pads 411, control circuitry, and four modes (Mode 0, Mode 1, Mode 2 and Mode 3). Each of the modes will be described in more detail below. The input/output pins 410 are usually located along the edges of a circuit package and are connected internally to the input/output pads 411 in a conventional manner (e.g., bonding). The input/output pads 411 are connected through input/output buffers to either control circuitry or directly to a zone that functions in accordance with its processed mode when that mode is enabled. The pins 410 and pads 411 are shared between modes which permits the multiple functions to be included on a single die. An input pin may be input-only or may be a bidirectional pin with the output disabled by the decoded mode of operation.

As illustrated, each mode is enabled by a respective mode enable signal. Thus, the particular Mode 0 is enabled by a Mode 0 enable signal; Mode 1 is enabled by a Mode 1 enable signal; Mode 2 is enabled by a Mode 2 enable signal; and Mode 3 is enabled by a Mode 3 enable signal. The Mode 0 enable signal, Mode 1 enable signal, Mode 2 enable signal and Mode 3 enable signal are generated by mode selection circuitry described below in connection with FIG. 5. In addition, the mode selection signals control the direction of signal flow on four groups of input/output pins 410 and pads 411.

The four zones located on a single die may be referred to as first, second, third and fourth application specific integrated circuits. Therefore, FIG. 4 shows an array based ASIC with four application specific integrated circuits. The first application specific integrated circuit, when activated, causes the array based ASIC to function only in Mode 0. The second application specific integrated circuit, when activated, causes the array based ASIC to function only in Mode 1. The third application specific integrated circuit, when activated, causes the array based ASIC to function only in Mode 2. The fourth application specific integrated circuit, when activated, causes the array based ASIC to function only in Mode 3.

Figure 10:
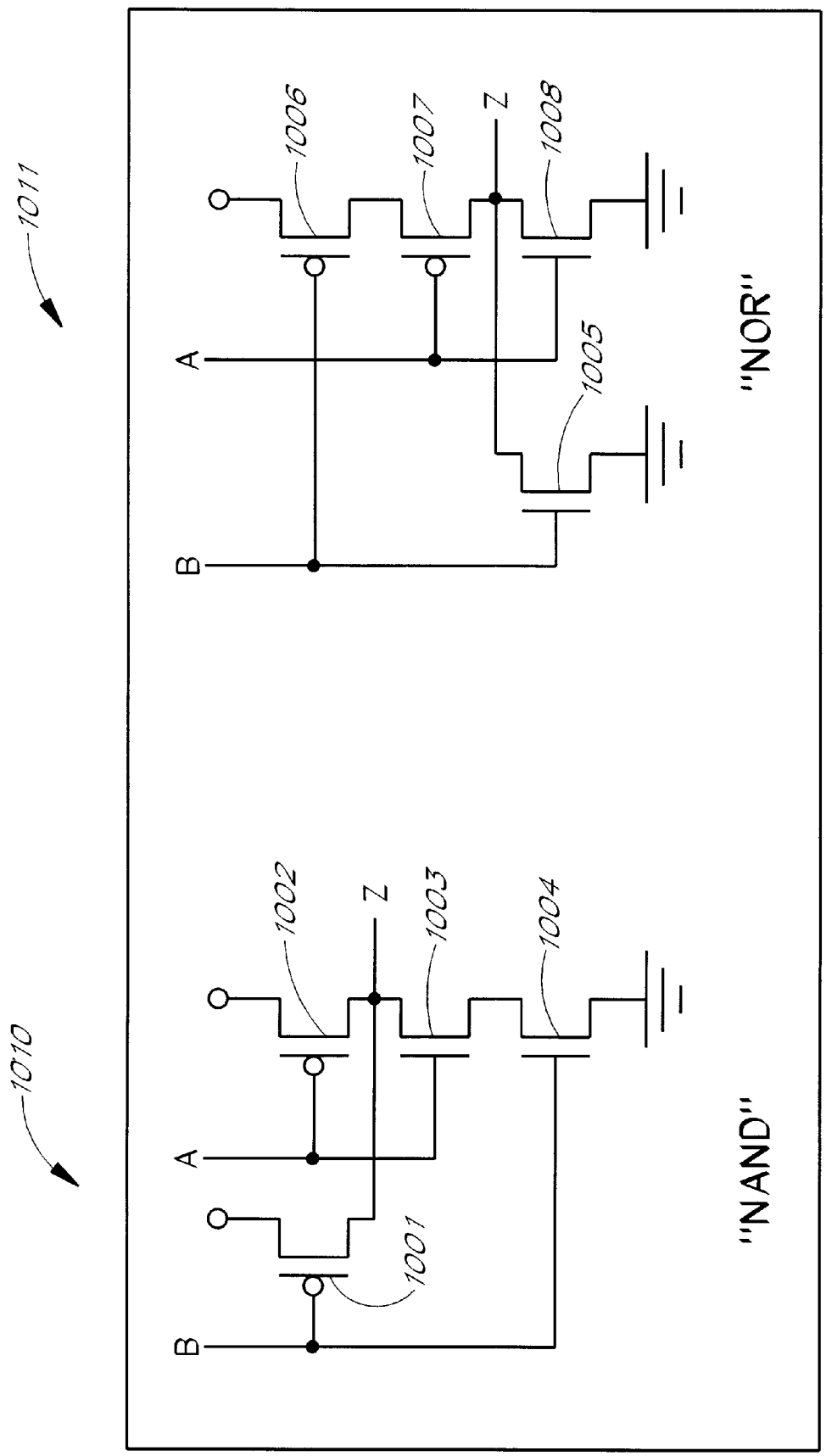
FIG. 10 illustrates a circuit diagram of exemplary interconnections of transistors to form logic gates.

The four zones, as well as the control circuitry within the array based ASIC 400, are manufactured by interconnecting transistors. The array based ASIC 400 can have tens of thousands to hundreds of thousands of transistors on a single die, which, when interconnected through a number of masking layers, produce all of the zones and control circuitry of an array based ASIC. For illustrative purposes, FIG. 10 shows how transistors 1001–1008 can be interconnected to form a NAND gate 1010 and to form a NOR gate 1011. Other types of gates can be formed through such interconnections of transistors. More complex logical elements comprise tens or hundreds of transistors interconnected to form gates and the interconnections between gates.

Referring again to FIG. 4, in this embodiment, when disabling other modes, ideally, the goal is to keep as much logic from switching as possible. Flip-flops, latches or multiplexers should not be allowed to switch in any mode other than the currently enabled mode. Dedicated clock pins are used when necessary to prevent metastable conditions from occurring in non-operational modes. These pins should be grounded when not in use. For greater speed, as well as for less noisy operation, output pins are not shared between modes if possible. If it is necessary to share outputs, they are multiplexed internally. In this embodiment, there are no internal tri-state output buffers.

Figure 5:
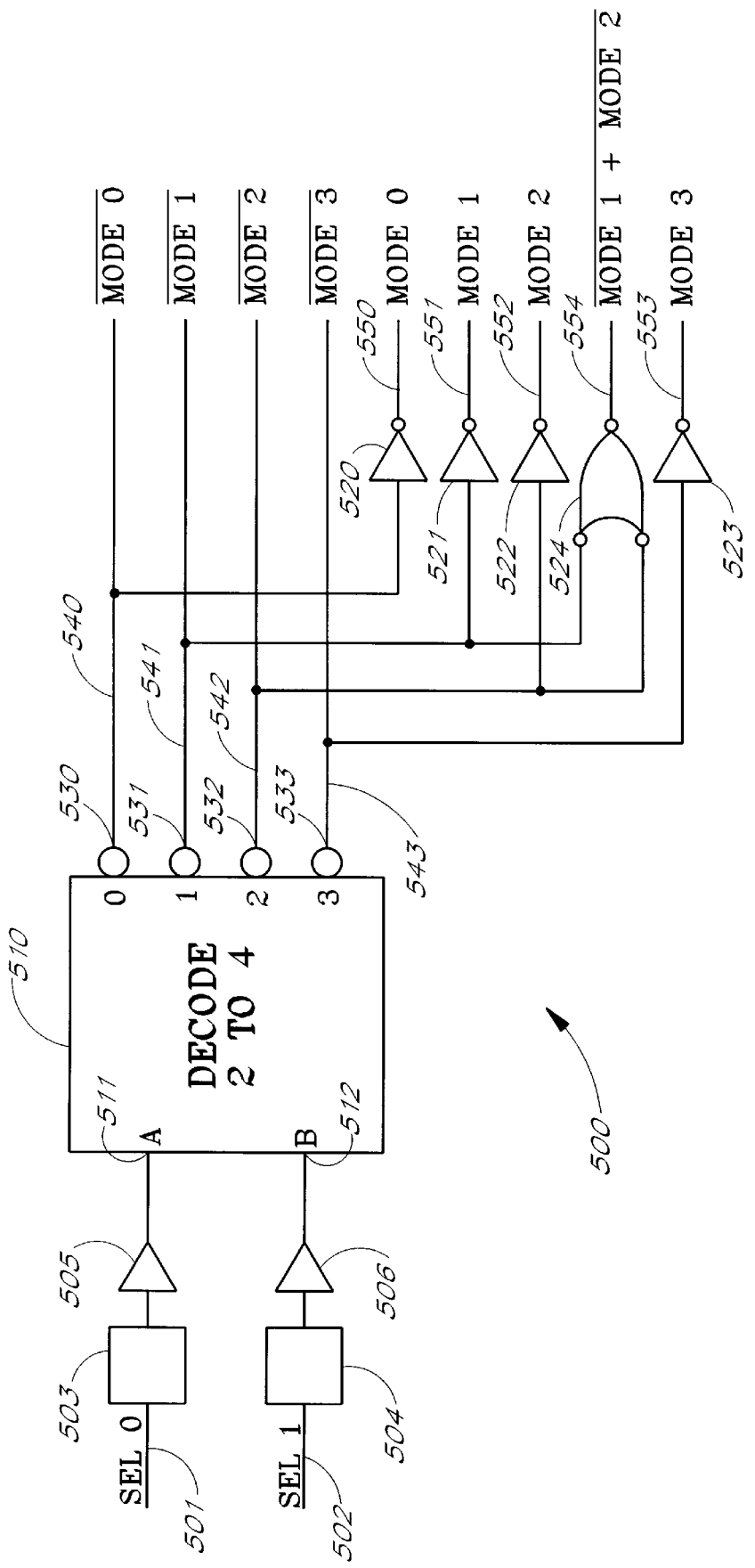
FIG. 5 illustrates a logic diagram of the mode selection in an array based ASIC.

FIG. 5 is a logic diagram for the mode selection circuitry 500. The mode selection circuity 500 determines the active mode in the array based ASIC 400 and comprises selection lines, SEL A 501 and SEL B 502, pads 503–504, input buffers 505–506, a decoder 510, and other digital logic 520–524. The selection lines 501–502 are connected to the pads 503–504, which are connected to the input buffers 505–506. The input buffers 505–506 are connected to inputs 511–512 to the decoder 510. In this embodiment, since there are only two selection lines 501–502, the decoder 510 is a two-to-four decoder. The decoder outputs 530–534 are each inverted and connected to respective lines 540–543, which carry the complements of the Mode 0, Mode 1, Mode 2 and Mode 3 signals, respectively. The decoder outputs 530–533 are inverted by respective inverters 520–523 whose output lines 550–553 carry the Mode 0, Mode 1, Mode 2 and Mode 3 signals, respectively. The inverted Mode 1 and Mode 2 signals on the lines 541 and 542 are connected to the inverted inputs of a NOR gate 524. The output of the NOR gate 524 is connected to a line 554 which carries the complement of the signal comprising Mode 1 OR Mode 2 where OR is the logical operation and where the signal or the line 554 is active low when either Mode 1 or Mode 2 is selected.

The selection lines 501–502 determine which mode is active and which modes are deactivated. In this embodiment, these selection lines 501–502 can either be connected to a pull-up voltage, $V_{HI}$, or to electrical ground, as illustrated in FIGS. 2 and 3. The mode selection pins 501–502 serve a dual purpose of enabling the proper mode of operation and disabling all other modes of operation. If the selection lines 501–502 are both connected to electrical ground (i.e., logical 00), then the Mode 0 enable signal on the line 550 is asserted and the other mode signals 551–553 are deasserted. If the first selection line 501 is connected to a pull-up voltage and the second selection line 502 is connected to electrical ground (i.e., logical 01), then line 551 is asserted and Mode 1 is enabled. Therefore, the array based ASIC 400 is functioning in Mode 1. Similarly, if the first selection line 501 is connected to electrical ground and the second selection line 502 is connected to a pull-up voltage (i.e., logical 10), then Mode 2 is enabled and the array based ASIC 400 functions only in Mode 2. If the first and second selection lines 501–502 are connected to a pull-up voltage (i.e., logical 11), then Mode 3 is enabled and the array based ASIC 400 functions only in Mode 3.

Figure 6:
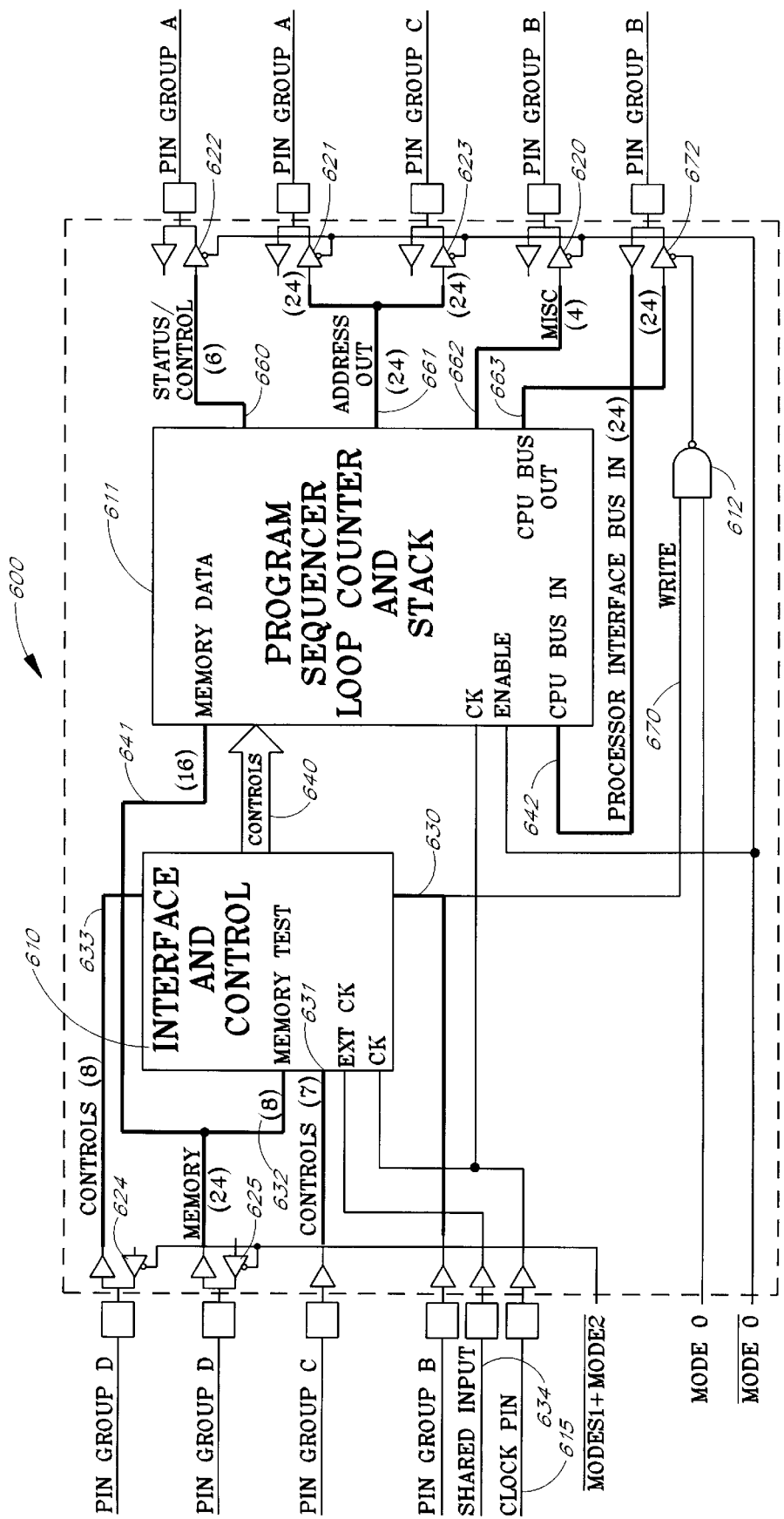
FIG. 6 illustrates a block diagram of circuitry of the mode zero functional elements.

FIG. 6 is a block diagram which illustrates one embodiment for a first application specific integrated circuit (first ASIC) 600. The first ASIC 600 functions as Mode 0 in the array based ASIC 400. The first ASIC 600 comprises an interface and control logic 610; program sequencer, loop counter and stack (CPU) 611; and write control logic 612. The interface and control logic 610 and the CPU 611 both receive the same clock signal 615. The first ASIC 600 is coupled to the input/output buffers, pads, and input/outputs of the array based ASIC 400.

When the Mode 0 enable signal is asserted, it enables the CPU 611 and the write control logic 612. The complement of the Mode 0 signal enables a 6-bit output 622 and a 24-bit output 621 into Pin Group A, a 4-bit output 620 into Pin Group B, and a 24-bit output 623 into Pin Group C. Since only the Mode 0 signal may be asserted, the complement of the signal comprising Mode 1 OR Mode 2 disables the output buffers 624–625 for Pin Group D.

A signal 630 from Pin Group B, 7 control signals bits 631 from Pin Group C, 8 control signals 633 from Pin Group D, 8 bits 632 for a memory test from Pin Group D, and a shared input 634 are clocked into the interface and control logic 610. Control commands 640 from the interface and control logic 610 are provided to the inputs of the enabled CPU 611 along with 16 bits of memory data 641 from Pin Group D, 24 bits of processor interface bus inputs 642 from Pin Group B, and a clock pulse 615. A 6-bit status/control signal 660 and a 24-bit address 661 are output from the CPU 611 and are provided as outputs on Pin Group A via the two enabled output buffers 621–622. A 4-bit miscellaneous signal 662 from the CPU 611 is also output from the enabled output buffer 620 to Pin Group B. One input signal 670 from Pin Group B is a write signal which enables a 24-bit CPU interface bus output 663 to pass from a buffered output 672 via Pin Group B.

Figure 7:
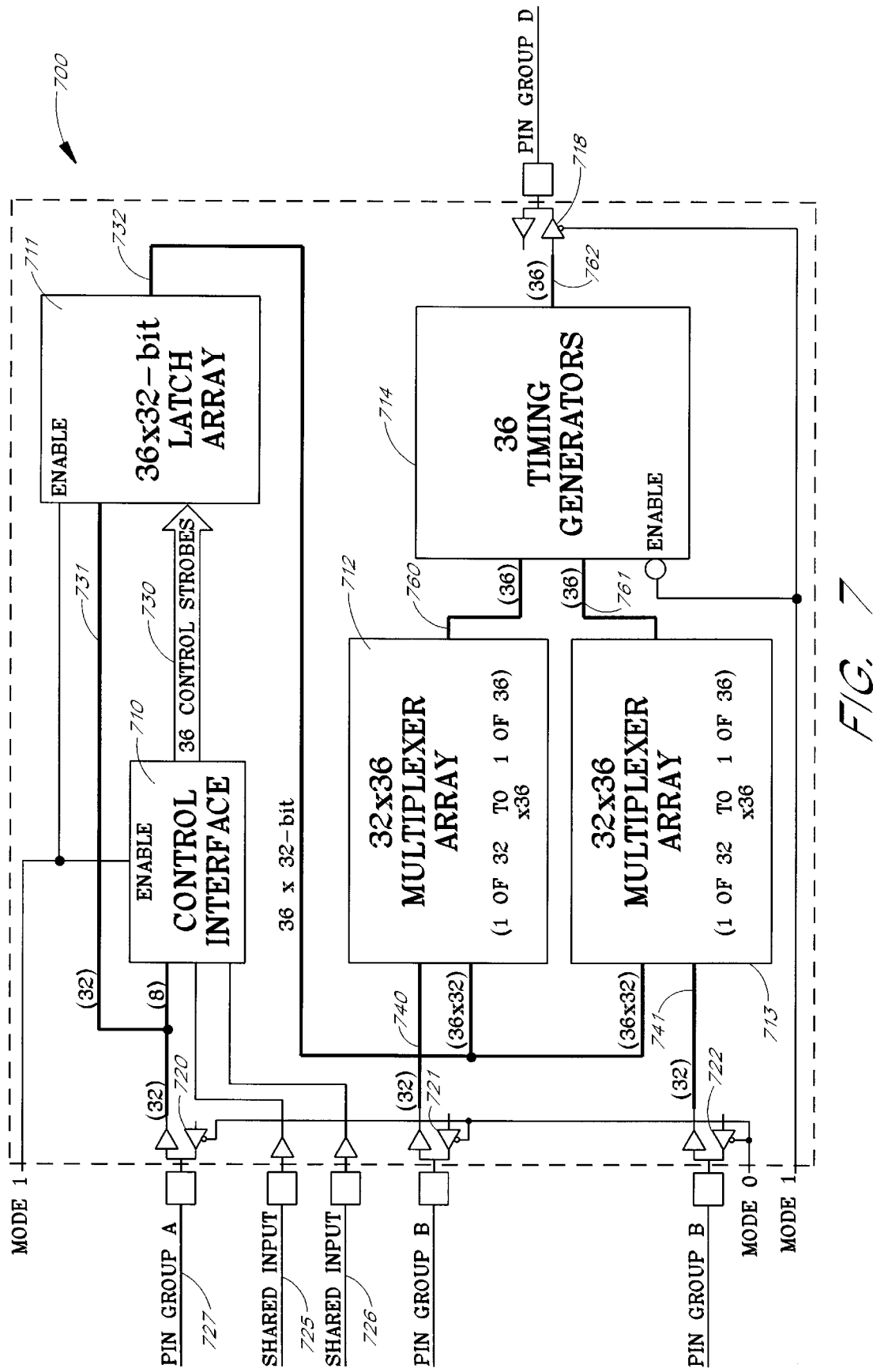
FIG. 7 illustrates a block diagram of circuitry of the mode one functional elements.

FIG. 7 is a logic diagram illustrating one embodiment for a second application specific integrated circuit (second ASIC) 700. The second ASIC 700 functions as Mode 1 in the array based ASIC 400. The second ASIC 700 comprises a control interface 710, a 36×32-bit latch array 711, two 32×36 multiplexer arrays 712–713 and 36 timing generators 714. The second ASIC 700 is coupled to the input/output buffers, pads, and input/outputs of the array based ASIC 400.

When the Mode 1 enable signal is asserted, both the control interface 710 and the latch array 711 become enabled. The complement of Mode 1 signal enables the timing generators 714 and the 36 outputs 718 connected to Pin Group D. Since Mode 1 is the only asserted mode, the complement of Mode 0 disables the output buffers 720–722 utilizing Pin Group A, Pin Group B, and Pin Group C.

Two shared inputs 725–726 and 8 bits 727 from Pin Group A are provided to the inputs of the enabled control interface 710. The control interface 710 produces 36 control strobes 730 which are provided to the inputs of a 36×32-bit latch array 711 along with 32 bits 731 from Pin Group A. The output 732 of the 36×32-bit latch array 711 are provided to the inputs of first and second 32×36 multiplexer arrays 712–713. The first multiplexer array receives 32 bits 740 from Pin Group B and the second multiplexer array receives 32 bits 741 from Pin Group C. The 36-bit outputs 760–761 from the first and second multiplexer arrays 712–713 are provided to the inputs of 36 enabled timing generators 714. The 36 output bits 762 of the 36 timing generators 714 pass through the enabled output buffer 718 connected to Pin Group D.

Figure 8:
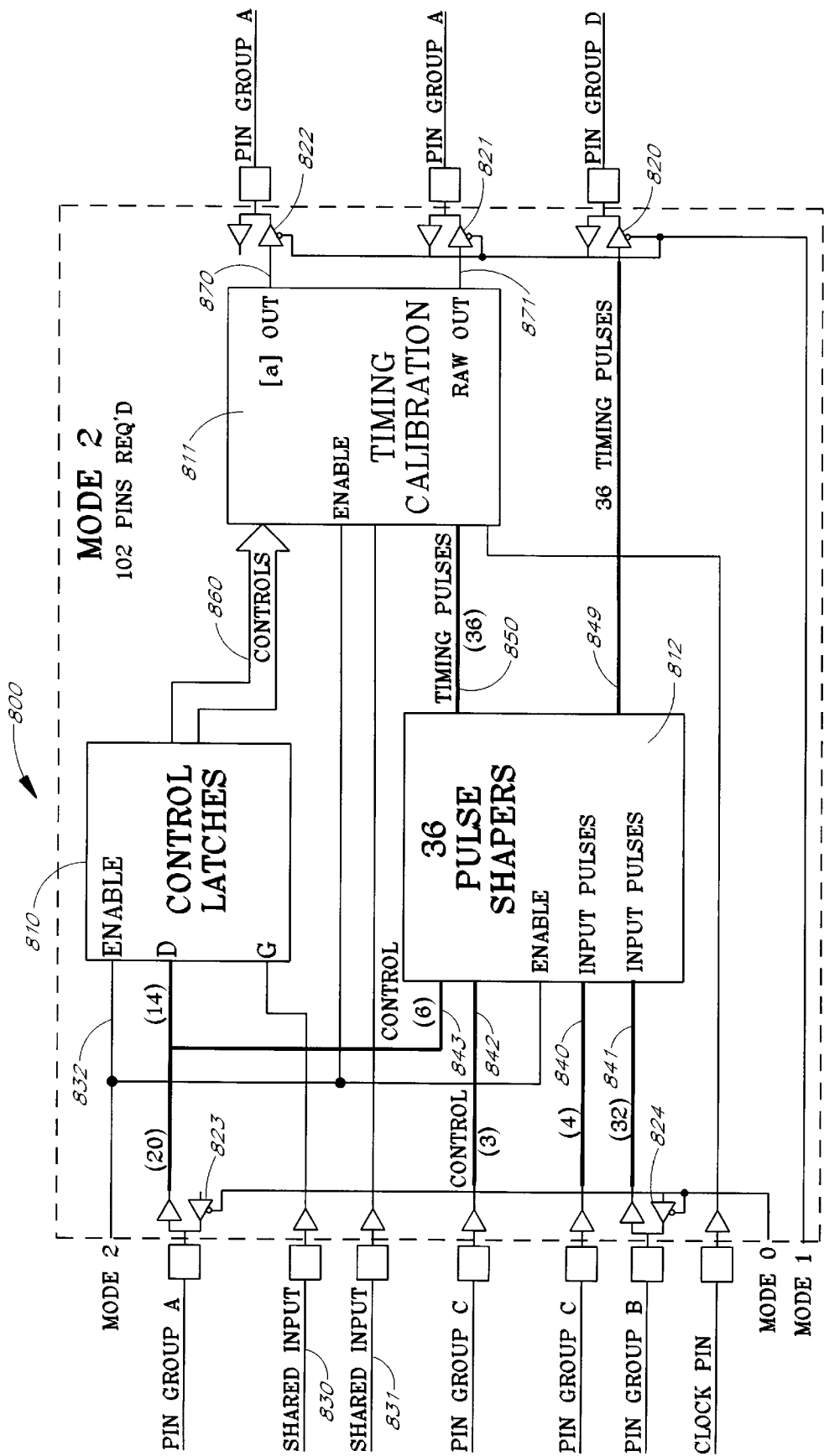
FIG. 8 illustrates a block diagram of circuitry of the mode two functional elements.

FIG. 8 is a logic diagram illustrating one embodiment for a third application specific integrated circuit (third ASIC) 800. The third ASIC 800 functions as Mode 2 in the array based ASIC 400. The third ASIC 800 comprises control latches 810, timing calibration circuitry 811, and pulse shapers 812. The third ASIC 800 is coupled to the input/output buffers, pads, and input/outputs of the array based ASIC 400.

When the Mode 2 enable signal is asserted, the control laches 810, timing calibration 811 and pulse shapers 812 are enabled. The complement of the Mode 2 signal enables the 36-pin output buffer 820 connected to Pin Group D and the two single-bit output buffers 821–822 connected to Pin Group A. Furthermore, since only Mode 2 is asserted, the complement of the Mode 0 signal disables the 30-bit output buffer 823 of Pin Group A and the 28-bit output buffer 824 of Pin Group B.

A first shared input 830 and 14 bits 832 from Pin Group A are provided to the inputs of the enabled control latches 810. Input pulses 840–841 of 4 bits and 32 bits from Pin Group C and Pin Group B, respectively, and control signals 842–843 of 6 bits and 3 bits from Pin Group A and Pin Group C, respectively, are provided to the inputs of the 36 enabled pulse shapers 812. Thirty-six timing pulses are provided on the output 849 of the pulse shapers and exit the circuitry through Pin Group D. Control signals from the control latches 860, a second shared input 831, and timing pulses 850 from the pulse shapers are clocked into a timing calibration. The calibration output 870 and raw output 871 are each connected to Pin Group A through single-bit enabled outputs.

Figure 9:
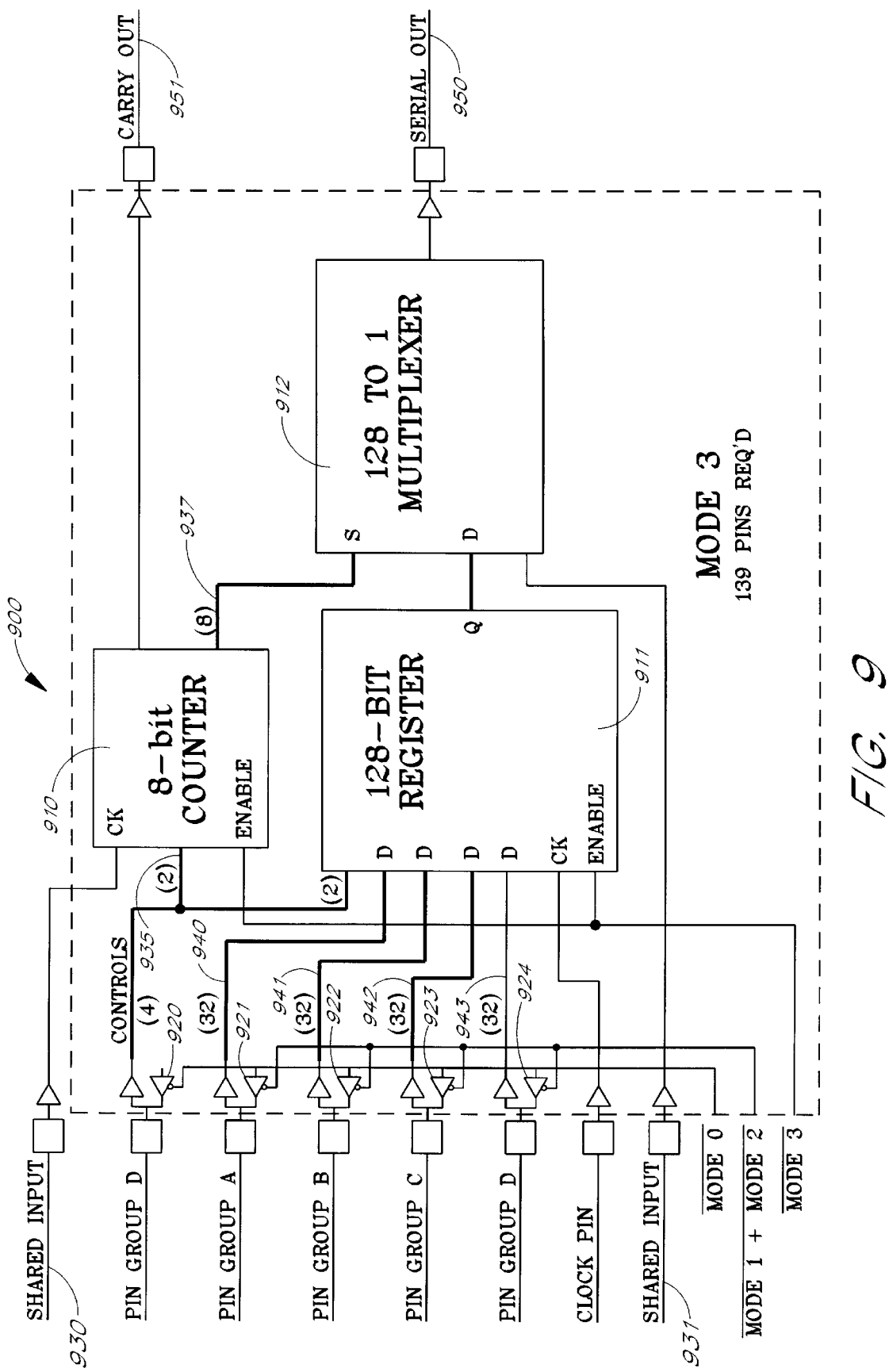
FIG. 9 illustrates a block diagram of the mode three functional elements.

FIG. 9 is a logic diagram illustrating one embodiment for a fourth application specific integrated circuit (fourth ASIC) 900. The fourth ASIC 900 functions as Mode 3 in the array based ASIC 400. The fourth ASIC 900 comprises an 8-bit counter 910, a 128-bit register 911, and a 128-to-1 multiplexer 912. The fourth ASIC 900 is coupled to the input/output buffers, pads, and input/outputs of the array based ASIC 400.

When the Mode 3 enable signal is asserted, the counter 910 and the register 911 are enabled. Since only Mode 3 can be asserted, the complement of the Mode 0 signal disables an output buffer 920 to Pin Group D. The complement of the signal comprising Mode 1 OR Mode 2 disables output buffers 921–924 connected to Pin Group A, Pin Group B, Pin Group C and Pin Group D.

A first shared input 930 clocks the enabled counter 910 with a 2-bit control signal 935 at its input. Pin Group A, Pin Group B, Pin Group C and Pin Group D each place a 32-bit signal 940–943 and Pin Group D also supplies 2 control bits 936 at the inputs of the 128-bit clocked and enabled register 911. The register 911 transfers the 128 bits of data on its input to its output Q. An 8-bit control signal 937 from the counter 910, a second shared input signal 931, and the 128-bit output Q of the register are provided to the inputs of the 128-to-1 multiplexer 912. The output of the multiplexer 912 propagates out through a serial output 950. The counter 910 also has a carry-out bit which exits through the carry-out output 951.

Although described above in terms of four separate, independent ASICs on a single die, it should be understood that the present invention can be advantageously used with more or fewer ASICs on a single die to more fully utilize the available transistors of a particular gate array.

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

What is claimed is:

1. A semiconductor gate array optimized to utilize a high percentage of gates of said gate array, said gate array comprising:
    a first application specific integrated circuit formed by interconnecting a first plurality of gates of said gate array;
    a second application specific integrated circuit formed by interconnecting a second plurality of gates of said gate array, said second plurality of gates comprising gates not included in said first plurality of gates; and
    a plurality of input/output connections on said gate array, said input/output connections including:
        a first plurality of connections which are input connections for said first application specific integrated circuit and which are output connections for said second application specific integrated circuit;
        a second plurality of connections which are input connections for said second application specific integrated circuit and which are output connections for said first application specific integrated circuit; and
        a third plurality of connections which are input connections for both said first application specific integrated circuit and said second application specific integrated circuit.

2. A semiconductor gate array die optimized to utilize a high percentage of gates on said die, said die comprising:
    a first application specific integrated circuit formed by interconnecting a first plurality of gates of said die;
    a second application specific integrated circuit formed by interconnecting a second plurality of gates of said die, said second plurality of gates comprising gates not included in said first plurality of gates; and
    a plurality of input/output connections on said die, said input/output connections including:
        a first plurality of connections which are input connections for said first application specific integrated circuit and which are output connections for said second application specific integrated circuit;
        a second plurality of connections which are input connections for said second application specific integrated circuit and which are output connections for said first application specific integrated circuit; and
        a third plurality of connections which are input connections for both said first application specific integrated circuit and said second application specific integrated circuit.

* * * * *

UNITED STATES PATENT AND TRADEMARK OFFICE
CERTIFICATE OF CORRECTION

PATENT NO.    : 6,157,051
DATED         : December 5, 2000
INVENTOR(S)   : Steven J. Allsup and Bjorn M. Dahlberg It is certified that error appears in the above-identified patent and that said Letters Patent is hereby corrected as shown below:

Please replace Claim 2 with the following Claim 2,

2. A single gate array having a plurality of gates, said gate array optimized to utilize a high percentage of said gates of said gate array, said gates being interconnectable as application specific integrated circuits, said gate array comprising:

means for interconnecting a first plurality of said gates in said gate array in accordance with a first interconnect pattern for a first application specific integrated circuit, said first application specific integrated circuit requiring a first plurality of input connections and a first plurality of output connections;

means for interconnecting a second plurality of said gates in said gate array in accordance with a second interconnect pattern for a second application specific integrated circuit, said second plurality of said gates including no gates from said first plurality of gates, said second application specific integrated circuit requiring a second plurality of input connections and a second plurality of output connections, said second plurality of input connections including at least one of said first plurality of output connections, said second plurality of output connections including at least one of said first plurality of input connections; and means for selectively activating only one of said first and second application specific integrated circuits at any particular time, and means for selectively activating said first plurality of output connections only when said first application specific integrated circuit is activated and selectively activating said second plurality of output connections only when said second application specific integrated circuit is activated.

Signed and Sealed this

Fifth Day of March, 2002

*Attest:*

*Attesting Officer*

JAMES E. ROGAN
*Director of the United States Patent and Trademark Office*